(12) United States Patent
Yeh et al.

(10) Patent No.: US 7,094,683 B2
(45) Date of Patent: Aug. 22, 2006

(54) DUAL DAMASCENE METHOD FOR ULTRA LOW K DIELECTRICS

(75) Inventors: Chen-Nan Yeh, Taipei (TW); Yung-Cheng Lu, Taipei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 170 days.

(21) Appl. No.: 10/633,909

(22) Filed: Aug. 4, 2003

(65) Prior Publication Data
US 2005/0032355 A1   Feb. 10, 2005

(51) Int. Cl.
*H01L 21/4763*   (2006.01)
(52) U.S. Cl. ...................... 438/623; 438/638
(58) Field of Classification Search ........ 438/623–624, 438/636–638
See application file for complete search history.

(56) References Cited

U.S. PATENT DOCUMENTS 5,840,203 A * 11/1998 Peng ........................... 216/66
6,323,121 B1 * 11/2001 Liu et al. ..................... 438/633
6,576,562 B1 * 6/2003 Ohuchi et al. ............... 438/725

\* cited by examiner

*Primary Examiner*—David Vu
(74) *Attorney, Agent, or Firm*—Tung & Associates

(57) ABSTRACT

A method for forming a dual damascene opening to protect a low-K dielectric insulating layer including providing a semiconductor process wafer comprising a via opening extending though a thickness portion of at least one dielectric insulating layer; depositing a first dielectric layer stack layer comprising at least one dielectric insulating layer over the at least one dielectric insulating to seal the via opening; blanket depositing a second dielectric layer stack comprising at least one dielectric layer to form a hardmask over and contacting the first dielectric layer stack; photolithographically patterning and etching through a thickness of the hardmask and the first dielectric layer stack to form a trench opening etching pattern overlying and encompassing the via opening while leaving the via opening sealed; and, etching through a thickness portion of the at least one dielectric insulating layer to form a dual damascene opening.

20 Claims, 2 Drawing Sheets

DUAL DAMASCENE METHOD FOR ULTRA LOW K DIELECTRICS

FIELD OF THE INVENTION

This invention generally relates to multi-layered semiconductor structures and more particularly to a method for forming dual damascene structures within ultra low-K dielectrics in a sub-micron integrated circuit manufacturing process.

BACKGROUND OF THE INVENTION

The escalating requirements for high density and performance associated with ultra large scale integration (ULSI) semiconductor wiring require increasingly sophisticated interconnection technology. As device sizes decrease it has been increasingly difficult to provide interconnection technology that satisfies the requirements of low resistance and capacitance interconnect properties, particularly where sub-micron inter-layer interconnects and intra-layer interconnects have increasingly high aspect ratios and densities.

In the fabrication of semiconductor devices, increased device density requires multiple layers, making necessary the provision of a multi-layered interconnect structure. Such a multi-layered interconnect structure typically includes intra-layer conductive interconnects and inter-layer conductive interconnects, formed by anisotropically etched openings in dielectric insulating layers, often referred to as an inter-metal dielectric (IMD) layer, and subsequently filling the openings with metal, for example copper. Commonly used inter-layer high aspect ratio openings are commonly referred to as vias, for example, when the opening extends through an insulating layer between two conductive layers. The intra-layer interconnects extend horizontally in the IMD layer to interconnect different areas within an IMD layer and are often referred to as trench lines. In one manufacturing approach, trench lines are formed overlying and encompassing one or more vias to form metal inlaid interconnects referred to as dual damascene structures.

In a typical process for forming multiple layer interconnect structure, for example, in a via-first dual damascene process, via openings are first anisotropically etched through an IMD layer by conventional photolithographic and etching techniques. A second anisotropically etched opening, referred to as a trench opening, is then formed according to a second photolithographic patterning process overlying and encompassing one or more of the via openings. The via openings and the trench opening together makeup the dual damascene structure which is subsequently filled with metal, for example, copper, followed by a CMP planarization process to planarize the wafer process surface and prepare the process surface for formation of another overlying level in a multi-level semiconductor device.

In particular, the undesirable effects of integrated circuit RC delay and signal crosstalk increase as integrated circuit densities increase, requiring increasingly low dielectric constants to decrease the parasitic capacitances of the dielectric insulating layers. For example, in design rule technologies of less than about 0.25 microns including 0.1 microns and lower, dielectric insulating layers having a dielectric constant of less than about 2.5, also referred to as ultra low-K dielectrics, are required to achieve acceptable circuit densities with reliable electrical behavior. Silicon dioxide based dielectric layers doped with carbon or organic substituents and forming an interconnecting porous structure within the $SiO_2$ matrix are increasingly desirable for forming IMD layers. Porous low-K materials have several drawbacks including enhanced absorption of chemical species which may easily migrate throughout the IMD layer.

One problem associated with absorption and migration of absorbed chemical species is photoresist poisoning, believed to be related to the interference of nitrogen species with chemically amplified deep ultraviolet (DUV) photoresists, typically used for 0.25 micron and below CMOS technology. Many DUV photoresists are chemically amplified using a photoacid generator activated by the light source to make an exposed area soluble in the development process. One problem affecting the anisotropicity of etching dual damascene features, particularly with respect to the trench portion etching process, is related to photoresist poisoning in the trench patterning process. For example, undeveloped photoresist residue from the trench patterning process frequently forms around the via opening prior to the trench etching process and tends to degrade etching profiles in both the trench portion and via portion of the completed dual damascene structure. The photoresist residue has been attributed to interference by residual nitrogen-containing containing species, for example amines, being released from the porous low-K materials in the patterning process after having been contaminated by a previous process, for example PECVD deposition of dielectrics such as hard masks, anti-reflective coatings, and etch stop layers.

Another problem with low-K materials including carbon doping or carbon-silicon substituents in a silicon dioxide matrix to form an IMD layer relates to the common practice of subjecting the trench patterning photoresist to a plasma ashing process following the trench etching process. The plasma ashing process has been found to damage the low-K material by depleting the carbon from the IMD layer and thereby increasing the dielectric constant of the IMD layer. Various approaches to solving processing problems with low-K dielectrics have been proposed. One approach includes partially or substantially filling the via with a photoresist material prior to trench etching. This approach has met with difficulties due to the formation of etching resistant polymeric residues around the via opening following the trench etching process. Another approach has been to use hard masks or liners for etching the trench to avoid damage to the low-K IMD layer during the photoresist ashing process. This approach has the drawback of leading to enlarged (faceted) trench openings due to etching process chemistries that are not sufficiently selective to the low-K material. Increasing the hard mask layer thickness to prevent trench opening faceting in the trench etching process has been found to have the undesirable effect of reducing surface planarity as well as requiring increased photoresist thickness over via portions in the trench pattering process thereby undesirably affecting patterning resolution.

There is therefore a need in the semiconductor processing art to develop a method to reliably pattern and etch dual damascene structures including avoiding photoresist poisoning and ashing damage to low-K materials to achieve improved device performance and reliability.

It is therefore an object of the invention to provide a method to reliably pattern and etch dual damascene structures including avoiding photoresist poisoning and ashing damage to low-K materials to achieve improved device performance and reliability while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for forming a dual damascene opening to protect a low-K dielectric insulating layer.

In a first embodiment, the method includes providing a semiconductor process wafer comprising a via opening extending though a thickness portion of at least one dielectric insulating layer; depositing a first dielectric layer stack layer comprising at least one dielectric layer over the at least one dielectric insulating layer to seal the via opening; blanket depositing a second dielectric layer stack comprising at least one dielectric layer to form a hardmask over and contacting the first dielectric layer stack; photolithographically patterning and etching through a thickness of the hardmask and the first dielectric layer stack to form a trench opening etching pattern overlying and encompassing the via opening while leaving the via opening sealed; and, etching through a thickness portion of the at least one dielectric insulating layer to form a dual damascene opening.

These and other embodiments, aspects and features of the invention will be better understood from a detailed description of the preferred embodiments of the invention which are described in conjunction with the accompanying drawings.

DETAILED DESCRIPTION OF THE PREFERRED EMBODIMENTS

Although the method of the present invention is explained by exemplary reference to a via-first method of formation of a copper filed dual damascene structure in a multi-level semiconductor device, it will be appreciated that the method of the present invention is equally applicable for forming dual damascenes with other metal fillings including for example aluminum:copper alloys.

Figure 1A:
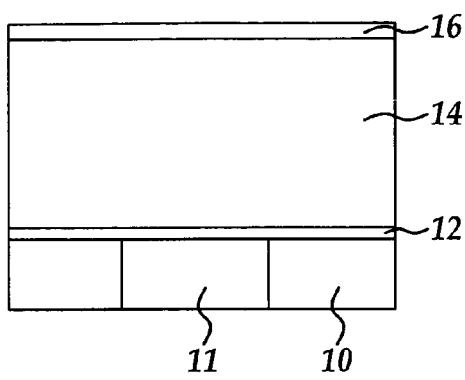
FIGS. 1A–1H are cross sectional views of an exemplary dual damascene structure at stages in a micro-integrated circuit manufacturing process according to an embodiment of the present invention.

For example, in an exemplary embodiment, referring to FIGS. 1A–1H, are shown cross sectional schematic views of a portion of a multi-level semiconductor device at stages in a dual damascene manufacturing process. Referring to FIG. 1A is shown a conductive region 11, for example, copper, formed in a dielectric insulating layer 10 having an overlying barrier layer 12, for example, formed of titanium nitride (e.g., TiN), silicon carbide (e.g., SiC), silicon oxycarbide (SiOC), silicon nitride (e.g., $Si_3N_4$), or silicon oxynitride (e.g., SION) formed by a conventional chemical vapor deposition (CVD) process including for example, LPCVD or PECVD, and having a thickness of about 300 Angstroms to about 1000 Angstroms.

Still referring to FIG. 1A, over the barrier layer 12 is formed a dielectric insulating layer 14, also referred to as an inter-metal dielectric (IMD) layer formed of, for example, a carbon doped silicon dioxide, also referred to as organo silicate glass (OSG) and C-oxide. Several commercially available formulations are available for producing the low-K carbon doped oxide, for example, known as SILK™ and BLACK DIAMOND™ according to conventional PECVD processes. In addition, the carbon doped oxides may be produced by PECVD methods using organo-silane precursors such as alkyl substituted cyclo-siloxanes where the dielectric constant may be varied over a range depending on the precursors and process conditions. The IMD layer is preferably formed having a dielectric constant less than about 2.5. Further, spin-on glass (SOG) low-K materials including silsesquioxanes, such as alkyl substituted silsesquioxanes, for example methyl-silsesquioxane (MSQ), may be suitably used to form the IMD layer 14. Preferably, the IMD layer 14 is formed having a thickness of about 4000 to about 8000 Angstroms.

Still referring to FIG. 1A, following deposition of the IMD layer 14, a dielectric anti-reflectance (DARC) layer 16, for example a single layer formed of silicon oxynitride (e.g., SiON) or silicon oxycarbide (e.g., SiOC), is deposited by an LPCVD or PECVD process to a thickness of about 1000 Angstroms to about 1500 Angstroms depending on the desired anti-reflectance properties. The DARC layer 16 is formed to reduce undesired light reflections from the IMD layer interface during subsequent photolithographic patterning processes.

Figure 1B:
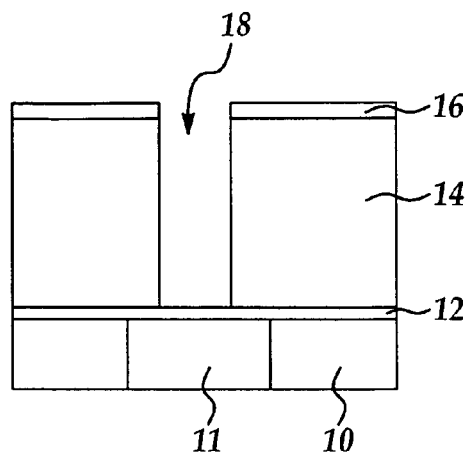

Referring to FIG. 1B, via openings, e.g., 18 are formed according to a conventional photolithographic patterning process followed by a conventional reactive ion etching (RIE) step. For example, the anisotropic etching step includes sequential etching steps including conventional plasma etching chemistries including hydrofluorocarbons, fluorocarbons, nitrogen, and oxygen to sequentially etch through a thickness of the DARC layer 16 and the IMD layer 14 to expose the barrier layer 12.

Figure 1C:
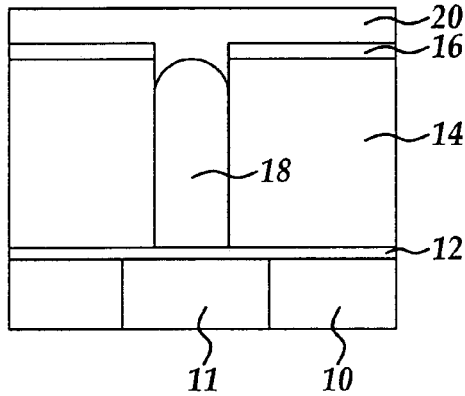

Referring to FIG. 1C, following anisotropically etching via openings e.g., 18, according to an aspect of the present invention, a first dielectric layer stack e.g., layer 20 including one or more layers of silicon oxide (e.g., $SiO_2$), silicon nitride (e.g., $Si_3N_4$), silicon oxynitride (e.g., SiON), silicon oxycarbide (e.g., SiOC), and hydrogenated silicon oxycarbide (SiOCH). The one or more dielectric layers, e.g., 18 are preferably deposited according to a first CVD process over the process surface including over the via openings, e.g., 18, to form at least one dielectric layer over the via opening level above the DARC layer 16 to close off and seal an upper portion of the via opening 18. Preferably, the dielectric layer stack e.g., 20 is deposited to an overall thickness of about 1000 Angstroms to about 2000 Angstroms thickness above the DARO layer 16.

Preferably, the first CVD process is carried out to result in a non-conformal deposition process during deposition of at least the lowermost dielectric layer e.g., 20 to minimize and reduce dielectric material deposition within the via while sealing the upper portion of the via opening 18 and producing a substantially planar uppermost surface. Preferably, the uppermost dielectric layer of the dielectric layer stack, e.g., 20 is deposited without leaving an area of decreased thickness (depression) over the via opening area. Optionally, a CMP process to further planarize the surface of the first dielectric layer stack may be carried out following the CVD deposition process. Providing a substantially planar uppermost surface is an important aspect of the invention to achieve improved photolithographic patterning resolution in a subsequent trench patterning process.

For example, atmospheric APCVD or PECVD processes at temperatures from about 250° C. to about 500° C. may be suitably used to deposit the first dielectric layer stack due to the enhanced ability at lower temperatures to achieve a relatively non-conformal character of the deposited layers to reduce dielectric material deposition within the via while achieving a substantially planar uppermost surface. For example, the CVD deposition processes may be carried out initially at lower deposition temperatures. For example, in a PECVD process, the process wafer may be advantageously cooled to temperatures less than about 250° C. to reduce adatom migration and reemission thereby reducing material deposition within the via opening. For example, during at least the initial period of the first CVD deposition process, preferably the substantial part of the deposition occurs in an upper portion of the via to create a keyhole effect thereby closing off and sealing the upper portion of the via.

In another embodiment, the first CVD deposition process, for example a PECVD or APCVD deposition process to deposit the dielectric layer stack is preferably a multi-step process where a first CVD deposition step is carried out at a first lower deposition temperature, for example less than about 300° C. to produce a relatively non-conformal deposition to seal the upper portion of the via followed by a second or subsequent higher temperature CVD deposition step carried out at greater than about 300° C., for example about 400° C., to achieve both higher deposition rates and a denser material for higher etching resistance. Advantageously, the first lower temperature deposition step where a portion of the dielectric material is deposited within the via, produces a lower density material having a higher etching rate that is more easily removed in a subsequent trench etching step.

Figure 1D:
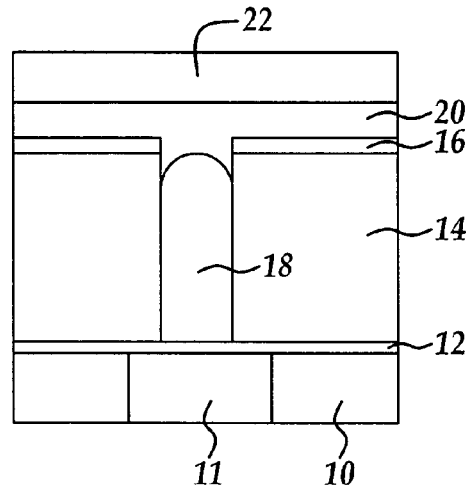

Referring to FIG. 1D, following CVD deposition of the first dielectric layer stack 20 to seal the via opening 18, a second dielectric layer stack including one or more layers of silicon nitride (e.g., $Si_3N_4$), silicon oxynitride (e.g., SiON), and silicon oxycarbide (e.g., SiOC) is deposited by a second CVD process to form a hardmask layer 22 over the first dielectric layer stack at a thickness of about 2000 Angstroms to about 4000 Angstroms. In the second CVD process, a blanket deposition is preferably carried out at higher temperatures compared to the deposition temperatures of the first dielectric layer stack, for example the lowermost portion of the first dielectric layer stack to seal the via opening 18. For example, PECVD or APCVD deposition temperatures are carried out at temperatures from about 300° C. to about 450° C. thereby providing dielectric layers with increased etching resistance. It will be appreciated that a low pressure, high temperature CVD process such as LPCVD may be suitably used for the second CVD process, for example, using a hot-walled reactor at a temperature of about 700° C. to about 800° C.

Figure 1E:
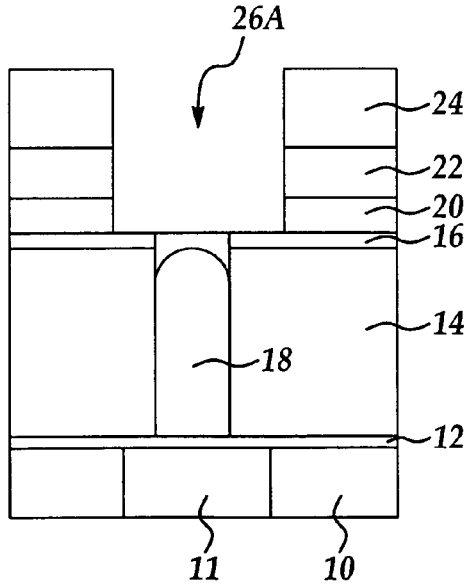

Referring to FIG. 1E, a second conventional photolithographic patterning process is then carried out including blanket depositing and patterning a photoresist layer 24 to form a trench line opening etching pattern. According to an aspect of the present invention a first reactive ion etching (RIE) process is then carried out to first etch through a thickness of the hardmask layer (second dielectric layer stack) 22 overlying and encompassing via opening e.g., 18, followed by etching through a thickness portion of the first dielectric layer stack 20 to expose DARC layer 16 to form a trench line opening etching pattern 26A. Preferably, following the first RIE etching process, the via opening 18 remains sealed with a portion of the first dielectric stack 20 sealing off an upper portion of the via opening 18. Following the first RIE etching process, the photoresist layer 24 is preferably removed by a conventional ashing process, the sealed via opening advantageously protecting the low-K IMD layer 14 material from damage and carbon depletion during the ashing process, thereby preserving a dielectric constant, preferably less than about 2.5.

Figure 1F:
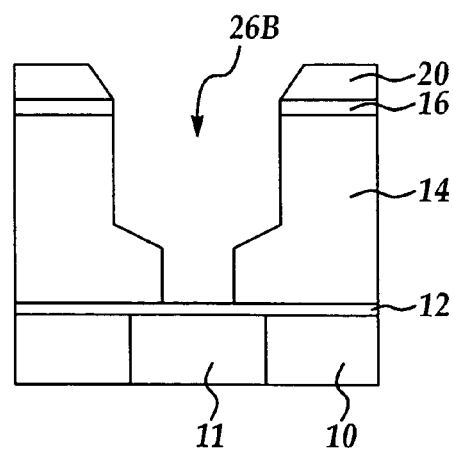

Referring to FIG. 1F, in a second RIE process, the trench opening pattern 26A is etched to extend through a thickness of portion of the IMD layer 14 to form a dual damascene opening 26B. During the second etching process, a remaining portion of the dielectric layer stack 20 including material deposited within the via opening 18 is removed from the via opening portion including the sidewalls and bottom portion of the via opening 18 to reveal the barrier layer 12. For example, the plasma etch chemistry includes fluorocarbons such as $CF_4$, in addition to at least one of $N_2$, $O_2$, and Ar. Preferably, during the etching process the second dielectric layer stack 22 is at least partially removed. It will be appreciated that the second RIE etching process may produce faceted portions at the via opening/trench opening level as well as in the remaining portion of the first dielectric layer stack 20.

Figure 1G:
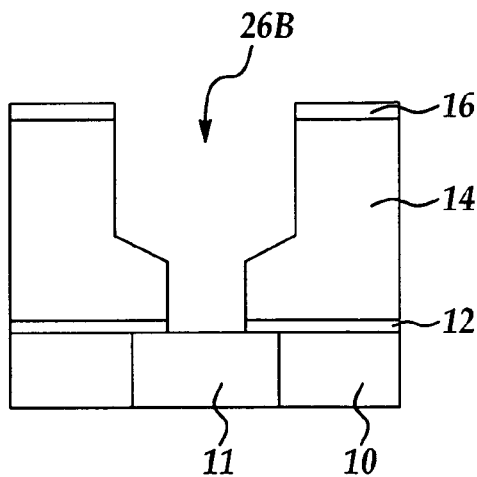

Referring to FIG. 1G, a third RIE process is then carried out to remove barrier layer 12 to reveal the underlying conductive region, for example copper, while simultaneously removing a remaining portion of the first dielectric layer stack 20 to reveal the DARC layer 16 at the wafer process surface.

Figure 1H:
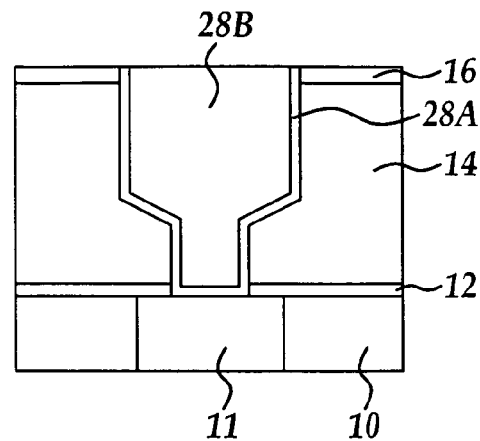

Referring to FIG. 1H, the dual damascene structure is then completed according to conventional processes. For example, the dual damascene opening is filled with metal, for example, a copper layer 28B according to an electrochemical deposition (ECD) process followed by a CMP process to remove excess copper above the trench opening to complete the formation of a dual damascene. Prior to ECD of copper layer 28B, a barrier/adhesion layer e.g., 28A of, for example, tantalum nitride, is blanket deposited to line the dual damascene opening, followed by PVD deposition of a copper seed layer (not shown) to provide an electrodeposition surface for ECD deposition of copper layer 28B. A subsequent CMP process removes excess copper and at least portions of the barrier layer 28B and DARC layer 16 to planarize the process surface above the trench line opening level.

Figure 2:
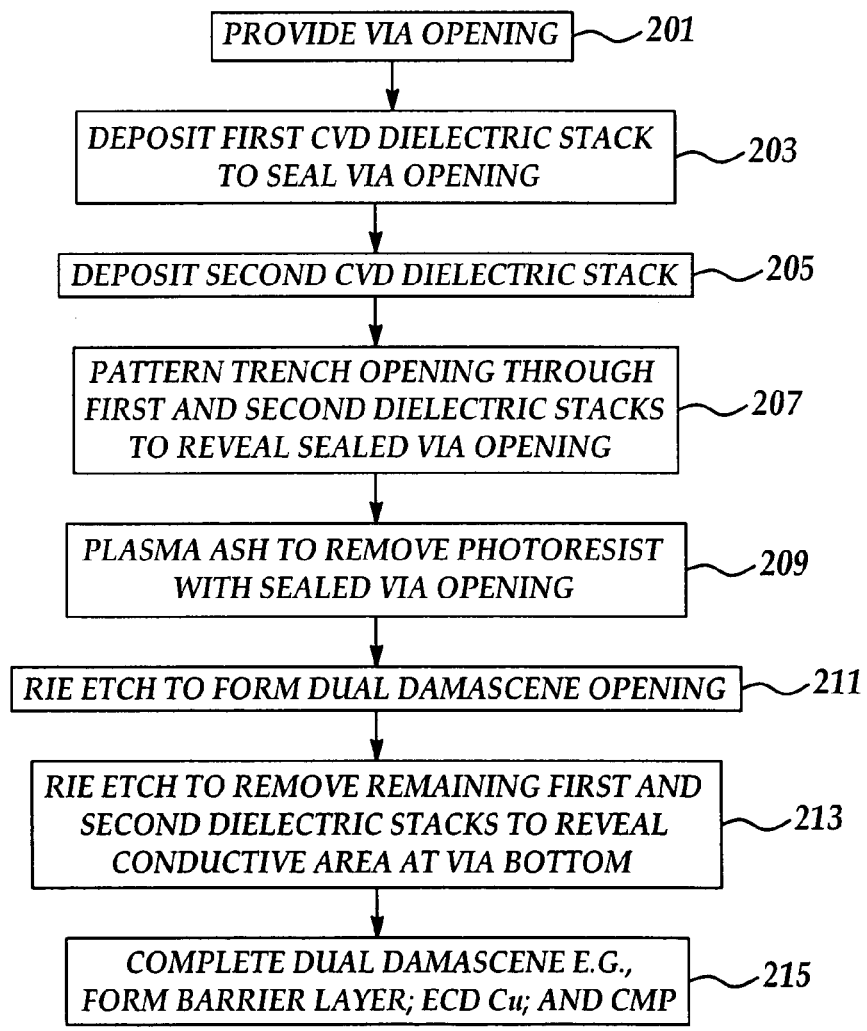
FIG. 2 is a process flow diagram including several embodiments of the present invention.

Referring to FIG. 2 is shown a process flow diagram including several embodiments of the present invention. In process 201, a semiconductor wafer including a process wafer having via openings extending through a low-K IMD layer is provided. In process 203, a first dielectric layer stack is deposited to seal the via opening while providing a substantially planar upper surface. In process 205, a second dielectric layer stack is deposited over the first dielectric layer stack. In process 207, a photoresist layer is deposited and a photolithographically patterned and etched through a thickness of the first and second dielectric layer stacks to form a trench opening etching pattern to reveal the sealed via opening. In process 209, an ashing in process is carried out to remove the photoresist layer without exposing the via opening. In process 211, a second RIE etching process is carried out to etch through a thickness portion of the low-K IMD layer to form a trench line opening overlying and encompassing the via opening to form a dual damascene opening. In process 213, a third etching process is carried out to remove remaining portions of the hardmask layer and the first dielectric layer stack material to reveal an underlying conductive area in closed communication with the dual damascene opening. In process 215, conventional processes are carried out to complete the dual damascene including a barrier/adhesion layer deposition step, a metal filling deposition step and a CMP planarization process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a dual damascene opening to protect a low-K dielectric insulating layer from an ashing process comprising the steps of:
   providing a semiconductor process wafer comprising a via opening extending though a thickness portion of at least one dielectric insulating layer;
   depositing a first dielectric layer stack comprising at least one dielectric layer over the at least one dielectric insulating layer to seal the upper portion of the via opening;
   blanket depositing a second dielectric layer stack comprising at least one dielectric layer to form a hardmask over and contacting the first dielectric layer stack; the first and second dielectric layer stacks are formed according to a first and second CVD process respectively, the first CVD process comprises a CVD deposition process comprising at least one of a lower temperature and a higher pressure compared to the second CVD process,
   photolithographically patterning an overlying photoresist layer and reactive ion etching through a thickness of the hardmask and the first dielectric layer stack to form a trench opening etching pattern overlying and encompassing the via opening while leaving the via opening sealed;
   removing the photoresist layer according to an ashing process with the via opening sealed; and
   reactive ion etching through a thickness portion of the at least one dielectric insulating layer to form a dual damascene opening.

2. The method of claim 1, wherein the step of depositing the first dielectric layer stack forms a substantially planar upper surface.

3. The method of claim 1, wherein the at least one dielectric insulating layer comprises a low-K inter-metal dielectric (IMD) layer having a dielectric constant of less than about 2.5.

4. The method of claim 3, wherein the low-K IMD layer is selected from the group consisting of carbon doped silicon oxide, organo-silicate glass, spin-on carbon doped glass, and silsesquioxanes.

5. The method of claim 3, wherein the at least one dielectric insulating layer consists essentially of the low-K IMD layer and an overlying dielectric anti-reflective coating (DARC) layer selected from the group consisting of silicon oxynitride, and silicon oxycarbide.

6. The method of claim 1, wherein the first CVD process is selected form the group consisting of atmospheric CVD and plasma enhanced CVD.

7. The method of claim 1, wherein the first CVD process comprises a non-conformal deposition process to selectively seal an upper portion of the via opening while forming a keyhole in a lower portion of the via opening.

8. The method of claim 1, wherein the first dielectric layer stack comprises the at least one dielectric layer selected from the group consisting of silicon dioxide, silicon nitride, silicon oxynitride, silicon oxycarbide, and hydrogenated silicon oxycarbide.

9. The method of claim 1, wherein the second dielectric stack comprises the at least one dielectric layer selected from the group consisting of silicon nitride, silicon oxynitride, and silicon oxycarbide.

10. The method of claim 1, further comprising carryout a subsequent reactive ion etching process to remove a remaining portion of the first and second dielectric layer stacks while removing a barrier layer disposed at the via opening bottom portion to form closed communication with an underlying conductive area.

11. The method of claim 1, wherein the step of depositing a first dielectric layer stack to seal the upper portion of the via opening forms a keyhole within a lower portion of the via opening.

12. A method for forming a copper filled dual damascene formed in a low-K dielectric insulating layer to prevent damage during an ashing process comprising the steps of:
    providing a semiconductor process wafer comprising a via opening extending though a thickness portion of at least one dielectric insulating layer;
    depositing a first dielectric layer stack comprising at least one dielectric layer according to a first CVD process over the via opening to close off and selectively seal an upper portion of the via opening;
    depositing a second dielectric layer stack according to a second CVD process comprising at least one dielectric layer to form a hardmask over and contacting the first dielectric layer stack; the first CVD process comprises at least one of a lower deposition temperature and a higher pressure compared to the second CVD process to produce a lower etching resistance in a reactive ion etching process,
    photolithographically patterning an overlying photoresist layer and reactive ion etching through a thickness of the hardmask and the first dielectric layer stack to form a trench opening etching pattern overlying and encompassing the via opening while leaving the via opening sealed;
    carrying out a plasma ashing process to remove the photoresist layer without exposing an interior portion of the via opening; and,
    etching according to a second reactive ion etching process through a thickness portion of the at least one dielectric insulating layer to form a dual damascene opening.

13. The method of claim 12, wherein the at least one dielectric insulating layer comprises a low-K IMD layer having a dielectric constant of less than about 2.5.

14. The method of claim 13, wherein the low-K IMD layer is selected from the group consisting of carbon doped silicon oxide, organo-silicate glass, spin-on carbon doped glass, and alkyl substituted silsesquioxanes.

15. The method of claim 12, wherein the at least one dielectric insulating layer consists essentially of the low-K IMD layer and an overlying dielectric anti-reflective coating (DARC) layer selected from the group consisting of silicon oxynitride and silicon oxycarbide.

16. The method of claim 12, wherein the first CVD process comprises non-conformal deposition of at least a portion of a lowermost dielectric layer of the first dielectric layer stack to selectively seal an upper portion of the via opening while forming a keyhole in a lower portion of the via opening.

17. The method of claim 12, wherein the first dielectric stack comprises at least one dielectric layer selected from the group consisting of silicon dioxide, silicon nitride, silicon oxynitride, silicon oxycarbide, and hydrogenated silicon oxycarbide.

18. The method of claim 12, wherein the second dielectric stack comprises at least one dielectric layer selected from the group consisting of silicon nitride, silicon oxynitride, and silicon oxycarbide.

19. The method of claim 12, further comprising a subsequent reactive ion etching process to remove a remaining portion of the first and second dielectric layer stacks while etching through a barrier layer disposed at the via opening bottom portion to form closed communication with and underlying copper conductive area.

20. The method of claim 19, further comprising depositing and planarizing a copper layer to fill the dual damascene opening.

* * * * *